United States Patent
Chiu et al.

(10) Patent No.: US 8,847,662 B2
(45) Date of Patent: Sep. 30, 2014

(54) MIXER AND ASSOCIATED SIGNAL CIRCUIT

(71) Applicant: MEDIATEK Inc., Hsin-Chu (TW)

(72) Inventors: Wei-Hao Chiu, Taichung (TW);
Ang-Sheng Lin, Kaohsiung (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 13/802,975

(22) Filed: Mar. 14, 2013

(65) Prior Publication Data
US 2014/0070866 A1 Mar. 13, 2014

Related U.S. Application Data

(60) Provisional application No. 61/699,454, filed on Sep. 11, 2012.

(51) Int. Cl.
*G06F 7/44* (2006.01)
*H03D 7/14* (2006.01)

(52) U.S. Cl.
CPC .................................. *H03D 7/1491* (2013.01)
USPC ............................ 327/356; 455/326; 327/355

(58) Field of Classification Search
USPC ............................ 327/355–361; 455/323, 326
See application file for complete search history.

(56) References Cited

U.S. PATENT DOCUMENTS

| | | |
|---|---|---|
| 8,364,112 B2 * | 1/2013 | Xie et al. ....................... 455/323 |
| 2007/0072576 A1 | 3/2007 | Sjoland et al. |
| 2008/0309400 A1 | 12/2008 | van der Wagt |

OTHER PUBLICATIONS

Tillman, et al.: "A Bootstrapping Technique to Improve the Linearity of CMOS Passive Mixers"; Department of Electroscience Lund University; 2003; Symposium on VI SI Circuits Digest of Technical Papers.

\* cited by examiner

*Primary Examiner* — Dinh Le
(74) *Attorney, Agent, or Firm* — McClure, Qualey & Rodack, LLP

(57) ABSTRACT

A mixer for providing a mixed signal by mixing an input signal and an oscillation signal, comprising a follower and a switch. The follower is arranged to conduct a driving contribution from a bias terminal to an output terminal following a signal at an input terminal, wherein the input terminal and the bias terminal are respectively coupled to the input signal and the oscillation signal, and the output terminal is arranged to output the mixed signal. The switch is arranged to selectively conduct the output terminal to a reference level in response to alternating of the oscillation signal. An associated signal circuit is also disclosed.

14 Claims, 7 Drawing Sheets

MIXER AND ASSOCIATED SIGNAL CIRCUIT

This application claims the benefit of U.S. provisional application Ser. No. 61/699,454, filed Sep. 11, 2012, the subject matter of which is incorporated herein by reference.

FIELD OF THE INVENTION

The present invention relates to a mixer and associated signal circuit, and more particularly, to a mixer and associated signal circuit of low power consumption.

BACKGROUND OF THE INVENTION

Wired and wireless networks, such as mobile telecommunication networks, local area networks, positioning systems, broadcasting systems, sensor (e.g., biomedical sensor) networks and RF (radio frequency) networks using ISM (industrial, scientific and medical) radio bands, have become essential for modern daily life. In a network, when a transmitter needs to send digital information to a receiver, the transmitter encodes the digital information to a digital base-band (BB) signal, converts the digital base-band signal to an analog BB signal, modulates (up-converts) the analog base-band signal to a radio-frequency (RF) signal by mixing the analog base-band signal with a local oscillation (LO) signal generated by the transmitter, and performs power amplification to amplify the RF signal, such that the RF signal can be transmitted via network medium (e.g., air for wireless network). When the receiver receives the RF signal, it amplifies the received RF signal, demodulates (down-converts) the RF signal to a demodulated signal by mixing the RF signal with a local oscillation signal generated by the receiver, such that the digital information can be retrieved from the demodulated signal.

From aforementioned operation of network, it is recognized that signal mixing plays an essentially important role. For the transmitter, a large amount of power is consumed for power amplification and signal mixing. Besides power amplification which consumes the most power, signal mixing consumes less but comparable power, since prior art signal mixing is implemented by Gilbert mixers which include many active components (e.g., transistors) to dissipate currents, especially DC (direct-current) currents. As more networks have to operate under limited power (e.g., power supplied by battery), demands for low-power and low-supply (e.g., low supply voltage) emerge.

For a low-power transmitter, replacing active components by passive ones saves power. Thus, a prior art employs a passive mixer implemented by a switch transistor having a gate, a drain and a source respectively coupled to the LO signal, a digital-to-analog converter (DAC) and a power amplifier (PA); as the switch transistor turns on and off in response to alternating of the LO signal, the analog BB signal provided by the DAC is mixed with the LO signal and sent to the PA for power amplification. However, because the DAC has to drive input of the PA at frequency of the LO signal, the DAC needs to be implemented by current sources which drain a large amount of DC current. Hence, power saving effect of such prior art is greatly constrained.

SUMMARY OF THE INVENTION

An objective of the invention is providing a mixer arranged to provide a mixed signal by mixing an input signal and an oscillation signal. The mixer includes a buffer, a follower and a switch. The follower, e.g., a source follower, includes an input terminal, a bias terminal and an output terminal; the input terminal and the bias terminal are respectively coupled to the input signal and the oscillation signal, and the output terminal is arranged to output the mixed signal. The follower is arranged to conduct a driving contribution (e.g., current) from the bias terminal to the output terminal following a signal at the input terminal. The switch is coupled to the output terminal for selectively conducting the output terminal to a reference level in response to alternating of the oscillation signal. The buffer is coupled between the oscillation signal and the bias terminal for providing the driving contribution in response to the oscillation signal.

In an embodiment, the mixer further includes a bootstrap circuit coupled between the bias terminal and the input terminal for providing an add-on level in response to the oscillation signal, e.g., in response to a long-term average or DC component of the oscillation signal.

In an embodiment, the buffer can be implemented by an inverter. The bootstrap circuit can include a capacitor coupled between the bias terminal and the input terminal. The follower can include a transistor which has a gate, a drain and a source respectively coupled to the input terminal, the bias terminal and the output terminal. In an embodiment, a frequency band of the oscillation signal is higher than a frequency band of the input signal.

Besides frequency translation (e.g., up-conversion), the mixer of the invention can function as a polar transmitter, wherein the oscillation signal is arranged to carry a PM (phase-modulation) information, the input signal is arranged to carry an AM (amplitude-modulation) information, and the mixed signal is therefore an AM-PM-merged signal.

An objective of the invention is providing a signal circuit, e.g., a signal up-conversion suite for a transmitter. The signal circuit includes one or more converters (e.g., DACs), one or more mixers and an amplifier (e.g., a power amplifier). Each converter is arranged to provide a converted signal in response to an associated digital input. Each mixer is arranged to provide a mixed signal by mixing an associated converted signal and an oscillation signal. The amplifier is coupled to the mixer(s) for amplifying the mixed signal(s) and providing an amplified signal in response. Each converter includes a converter terminal for outputting the converted signal, and a plurality of converter capacitors commonly coupled to the converter terminal for selectively changing charges of the converter terminal in response to the associated digital input.

In an embodiment, each converter further includes a plurality of converter switches, each converter switch is arranged to selectively conduct one of the converter capacitors to a second reference level for sharing charges of the converter terminal in response to the associated digital input. In an alternative embodiment, each converter further includes a plurality of converter buffers, each of the converter buffers is arranged to selectively provide charges to one of the converter capacitors in response to the associated digital input.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
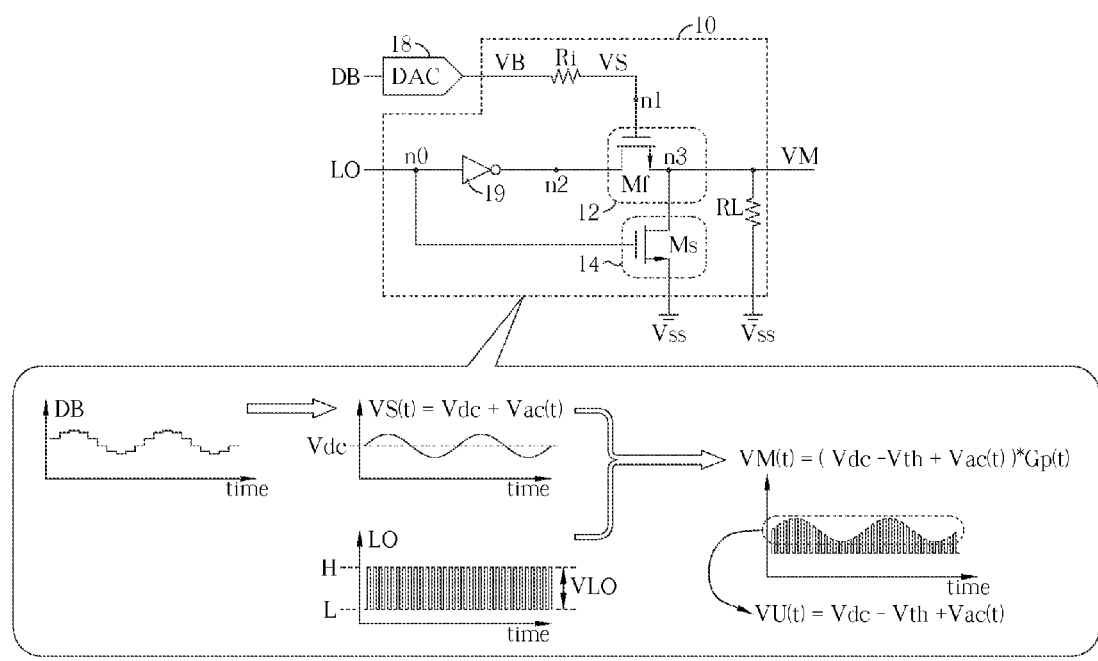
FIG. 1 illustrates a mixer according to an embodiment of the invention.

Please refer to FIG. 1 illustrating a mixer 10 according to an embodiment of the invention. The mixer 10 cooperates with a converter 18, e.g., a DAC, and includes resistors Ri and RL, a follower 12, a switch 14, and a buffer 19. The mixer 10 is arranged to mix a signal LO and a signal VB and accordingly provide a signal VM as a mixed signal at a node n3. For example, the signal LO can be a high-frequency oscillation signal alternating between two levels H and L, and the signal VB can be a relative low-frequency BB input signal which is converted from a digital input DB by the converter 18, thus the mixer 10 can perform up-conversion for a transmitter. Via the resistor Ri coupled between the converter 18 and the node n1, the signal VB is sent to a node n1 as a signal VS. The signal LO received at a node n0 is routed to the buffer 19 and the switch 14. The buffer 19 can be implemented by an inverter which is arranged to invert the signal LO, and accordingly provide a driving contribution (e.g., current) to the follower 12 via a node n2.

The follower 12 has an input terminal, a bias terminal and an output terminal respectively at the nodes n1, n2 and n3. For example, the follower can be include a transistor Mf, such as an n-channel MOS (metal-oxide-semiconductor) transistor having a gate, a drain and a source respectively coupled to the nodes n1, n2 and n3. The follower 12 is arranged to conduct driving contribution of the buffer 19 from the nodes n2 to n3 following the signal VS at the node n1, if voltage of the signal VS is high enough such that a voltage difference between the nodes n1 and n3 is greater than a threshold level to keep the transistor Mf turned-on. The threshold level can be the threshold voltage of the transistor Mf.

The switch 14 has a control terminal and two channel terminals respectively coupled to the nodes n0, n3 and a supply voltage Vss (e.g., ground voltage), and is arranged to selectively conduct between the node n3 and the supply voltage Vss (a reference level) in response to alternating of the signal LO. The switch 14 can include a transistor Ms, e.g., an n-channel MOS transistor having a gate, a drain and a source respectively coupled to the nodes n0, n3 and the supply voltage Vss.

When the signal LO is at the level H, the switch 14 is turned on to conduct between the node n3 and the supply voltage Vss, so the signal VM is pulled down to level of the supply voltage Vss. On the other hand, when the signal LO is at the level L, the switch 14 is turned off to stop conduction between the node n3 and the supply voltage Vss, so the signal VM at the node n3 is left to be determined by the follower 12; as long as the signal VS can keep the transistor Mf turned-on, the follower 12 will conduct driving current provided by the buffer 19 to load (e.g., the resistor RL) at the node n3 in response to the signal VS, and accordingly cause the signal VM to follow the signal VS with an offset level Vth subtracted. While the signal VS can be expressed by a sum of a DC component Vdc and an AC component Vac(t), the signal VM can therefore be expressed by VM(t)=(Vdc−Vth+Vac(t))*Gp(t), wherein the signal Gp(t) is a gating signal which equals 1 and 0 respectively when the signal LO is at the levels L and H. Hence, signal mixing is achieved since the signal Vac(t) in the signal VB is modulated in synchronization with the signal LO. By proper arrangement (e.g., appropriate setting of the component Vdc), the signal Vac(t) can be completed lifted above a cut-off level dependent on the level Vth, and thus be thoroughly included in an upper envelope VU(t) of the signal VM(t) without being truncated, as shown in FIG. 1.

Figure 2:
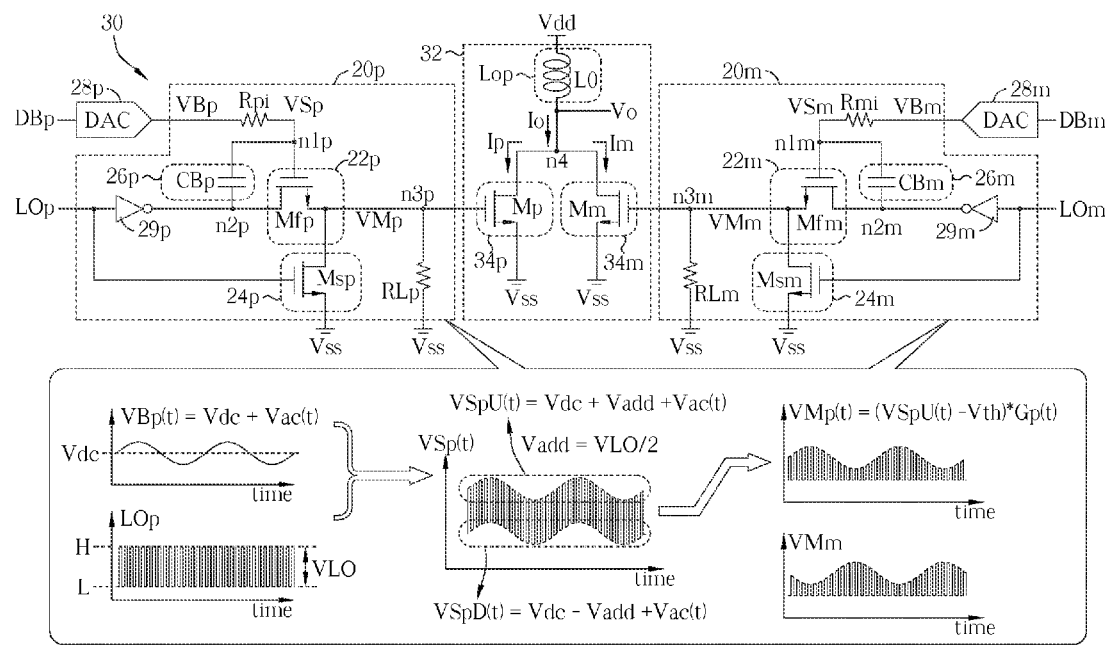
FIG. 2, FIG. 3, FIG. 4 and FIG. 5 respectively illustrate signal circuits according to embodiments of the invention.

Please refer to FIG. 2 illustrating a signal circuit 30 according to an embodiment of the invention. For example, the signal circuit 30, which operates between supply voltages Vdd and Vss, can serve as an analog frontend for a transmitter to interface a digital domain (not shown) by converters 28p and 28m, to perform up-conversion by mixers 20p and 20m, and to achieve power amplification by a power amplifier 32.

By digital-to-analog conversion, the converters 28p and 28m provide analog signal VBp and VBm in response to digital inputs DBp and DBm, respectively. The mixers 20p and 20m respectively mix the signals VBp and VBm with oscillation signals LOp and LOm to provide signals VMp and VMm as mixed signals. The amplifier 32 amplifies a combination of the signals VMp and VMm and accordingly provides a signal Vo as an amplified signal, which can then be transmitted to network via network medium, such as air.

The functional structures of the mixers 20p and 20m are the same. The mixer 20p includes resistors Rpi and RLp, a follower 22p, a switch 24p, a bootstrap circuit 26p and a buffer 29p. The resistor Rpi is coupled between the converter 28p and a node n1p, and the resistor RLp is coupled between a node n3p and the supply voltage Vss. The follower 22p can include a transistor Mfp (e.g., an n-channel MOS transistor) which has a gate, a drain and a source as an input terminal at the node n1 p, a bias terminal at a node n2p and an output terminal at the node n3p, respectively. The buffer 29p can be implemented by an inverter which inverts the signal LOp and according provides an associated driving contribution (e.g., current) to the node n2p.

The bootstrap circuit 26p can include a capacitor CBp coupled between the nodes n1p and n2p, so the bootstrap circuit 26p can provide an add-on level Vadd in response to the signal LOp, e.g., in response to a long-term average or DC component of the signal LOp. That is, the capacitor CBp can hold charges accumulated by the signal LOp to maintain a cross voltage, i.e., the level Vadd, between the nodes n1p and n2p; while the signal LOp alternates between the levels H and L with a swing equal to a voltage VLO, the level Vadd can be expressed by the voltage VLO/2. By coupling of the bootstrap circuit 26p, the signal VBp, (inversion of) the signal LOp and the level Vadd provided by the bootstrap circuit 26p will be summed at the node n1p to form a signal VSp. With the signal VBp including a DC component Vdc and an AC component Vac(t), the signal VSp will oscillate at frequency of the signal LOp with a swing confined between an upper envelope VSpU(t) and a bottom envelope VSpD(t), which can be respectively expressed by VSpU(t)=Vdc+Vadd+Vac(t) and VSpD(t)=Vdc−Vadd+Vac(t), as shown in FIG. 2.

The switch 24p can include a transistor Msp, e.g., an n-channel MOS transistor having a gate, a drain and a source respectively coupled to the signal LOp, the node n3p and the supply voltage Vss. When the signal LOp is at the level H, the switch 24p conducts the node n3p to the supply voltage Vss, so the signal VMp is pulled down to level of the supply voltage Vss (e.g., the level L). When the signal LOp is at the level L, the switch 24p stops conduction between the node n3p and the supply voltage Vss, so the signal VMp is left to be determined by the follower 22p. When the signal LOp is at the level L, if the signal VSp is greater enough such that a voltage difference between the nodes n1p and n3p is greater than the threshold voltage of the transistor Mfp, the follower 22p can conduct driving contribution of the buffer 29p to the node n3p to keep the signal VMp following the signal VSp with an offset level Vth subtracted. By proper arrangement (e.g., appropriate setting of the AC component Vac and the level Vadd), the upper envelope VSpU(t) of the signal VSp(t) is kept intact in the signal VMp(t), which can therefore be expressed by VMp(t)=(VSpU(t)−Vth)*Gp(t)=(Vdc+Vadd−Vth+Vac(t))*Gp(t), wherein the signal Gp(t) is a gating signal which equals 1 and 0 respectively when the signal LO is at the levels L and H. Note that the add-on level Vdd can be utilized to counteract/compensate subtraction of the offset level Vth.

Similar to the mixer 20p, the mixer 20m includes resistors Rmi and RLm, a follower 22m including a transistor Mfm, a switch 24m including a transistor Msm, a bootstrap circuit 26m including a capacitor CBm and a buffer 29m implemented by an inverter. By the bootstrap circuit 26m, inversion of the signal LOm at a node n2m, the add-on level Vadd accumulated by the capacitor CB and the signal VBm all sum at a node n1m to form a signal VSm. In response to the signal LOm, the buffer 29m provides associated driving contribution, and the switch 24m selectively conducts between a node n3m and the supply voltage Vss. When the signal LOm is at the level H, the signal VMm at the node n3m is pulled down to level of the supply voltage Vss. When the signal LOm is at the level L, if the signal VSm is sufficiently high, the follower 22m conducts driving contribution of the buffer 29m to the node n3m to keep the signal VMm following the signal VSm with the level Vth subtracted.

In an embodiment to implement a single-balanced mixer configuration, the signals LOp and LOm are differential; e.g., when the signal LOp is at the level H, the signal LOm is at the level L, and when the signal LOp is at the level L, the signal LOm is at the level H. In addition, the signals VBm and VBp are differential, e.g., the signal VBm can be expressed by VBm(t)=Vdc−Vac(t). By proper arrangement, the signal VMm(t) can be expressed by VMm(t)=(Vdc+Vadd−Vth−Vac(t))*Gm(t), wherein the signal Gm(t) is another gating signal expressed by Gm(t)=(1−Gp(t)).

The amplifier 32 includes two trans-conductance cells 34p and 34m, as well as a load Lop coupled between a node n4 and the supply voltage Vdd. The load Lop can include an inductor L0 and other impedance (not shown) coupled to the node n4. The trans-conductance cells 34p and 34m can be respectively implemented by transistors Mp and Mm, e.g., two matched n-channel transistors. The transistor Mp has a gate, a drain and a source respectively coupled to the node n3p, the node n4 and the supply voltage Vss; and the transistor Mm has a gate, a drain and a source respectively coupled to the node n3m, the node n4 and the supply voltage Vss. By voltage to current transferring, the trans-conductance cells 34p and 34m drives the currents Ip and Im respectively in response to the signal VMp and VMm; the node n4 sums the currents Ip and Im to form a current Io, which establishes a voltage signal Vo across the load Lop at the node n4. The current Io as well as the signal Vo can therefore reflect mixing of the signals Vac(t) and LOp(t) by combining the signals VMp and VMm, since combination (sum) of the signals VMp and VMm will oscillate at frequency of the signal LOp with a swing confined by the signal Vac(t).

Figure 3:
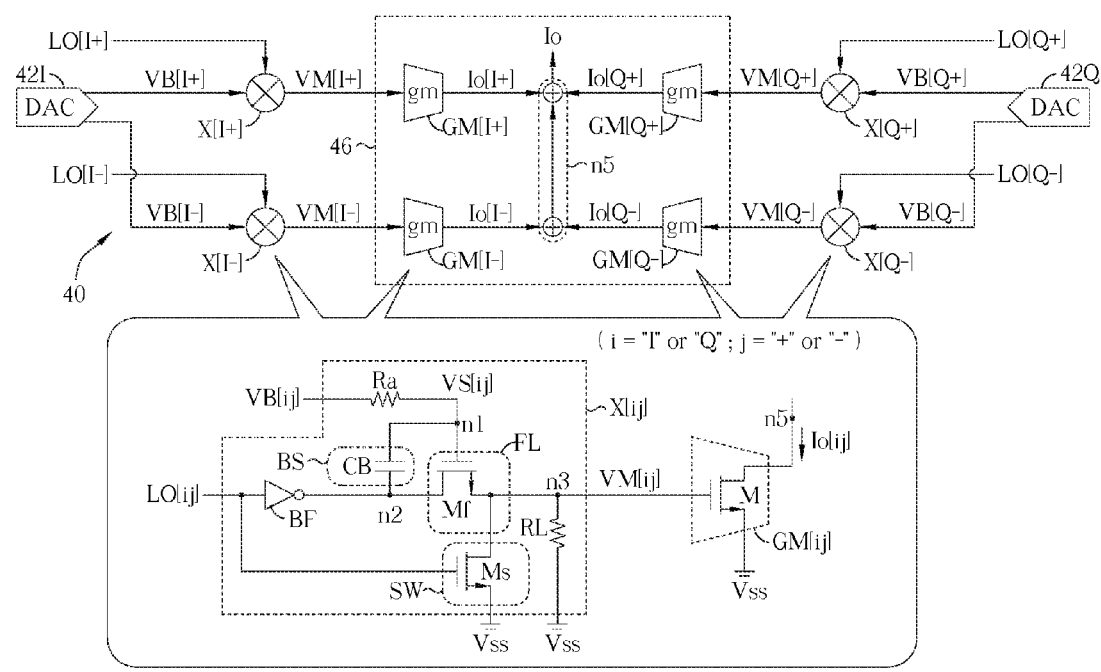

Please refer to FIG. 3 illustrating a signal circuit 40 according to an embodiment of the invention. The signal circuit 40 includes converters (e.g., DACs) 42I and 42Q, mixers X[I+], X[I−], X[Q+] and X[Q−], as well as an amplifier 46. The converter 42I provides two differential signals VB[I+] and VB[I−], and the converter 42Q provides two differential signals VB[Q+] and VB[Q−]. Circuitry architecture and operation of the mixers X[I+], X[I−], X[Q+] and X[Q−] can be identical. The mixer X[ij] (for i="I" or "Q", j="+" or "−") is arranged to receive the signal VB[ij] and a signal LO[ij] respectively as an input signal and an oscillation signal, and to provide a signal VM[ij] as a mixed signal by mixing the signals VB[ij] and LO[ij]. The amplifier 46 includes trans-conductance cells GM[I+], GM[I−], GM[Q+] and GM[Q−]. Circuitry architecture and operation of the trans-conductance cells GM[I+], GM[I−], GM[Q+] and GM[Q−] can be identical; the trans-conductance cell GM[ij] (for i="I" or "Q", j="+" or "−") is arranged to receive the voltage signal VM[ij] of the mixer X[ij], and to accordingly provide a current Io[ij] by trans-conductance. The currents Io[I+], Io[I−], Io[Q+] and Io[Q−] respectively provided by the trans-conductance cells GM[I+], GM[i−], GM[Q+] and GM[Q−] are then summed to form a total current Io as an amplified current signal.

Each mixer X[ij] includes resistors Ra and RL, a buffer BF, a follower FL, a bootstrap circuit FL and a switch SW. The signal VB[ij] is coupled to a node n1 via the resistor Ra. The buffer BF, e.g., an inverter, is arranged to invert the signal LO[ij] and to provide a driving contribution to a node n2 in response to inversion of the signal LO[ij]. The bootstrap circuit BS is coupled between the nodes n1 and n2, and is arranged to provide an add-on level in response to (long-term average of) the signal LO[ij]. The bootstrap circuit BS also couples inversion of the signal LO[ij] to the node n1, so the signal VB[ij] can ride on inversion of the signal LO[ij] and the add-on level to form the signal VS[ij]. The follower FL and the switch SW can respectively include transistors Mf and Ms, and cooperate to provide the signal VM[ij] at a node n3. When the signal LO[ij] is at the level H, the switch SW conducts the node n3 to the supply voltage Vss, so the signal VM[ij] is suppressed to level of the supply voltage Vss. When the signal LO[ij] is at level L, the switch SW does not conduct; if the signal VS[ij] is great enough to keep the transistor Mf turned-on, the follower FL can conduct the driving contribution of the buffer BF to drive the signal VM[ij], such that the signal VM[ij] can follow the signal VS[ij] with an offset level subtracted.

In cooperation with the mixer X[ij], each trans-conductance cell GM[ij] can include a transistor M which drains the current Io[ij] at a common node n5 in response to the signal VM[ij]. The trans-conductance cells GM[I+], GM[I−], GM[Q+] and GM[Q−] are commonly coupled to the node n5, so the currents Io[I+], Io[I−], Io[Q+] and Io[Q−] are summed at the node n5 to form the current Io.

The signal circuit 40 can be employed to implement single-balanced I-Q (in-phase and quadrature-phase) signal mixing. The signals VB[I+] and VB[I−] can be differential and carry in-phase information; the signals VB[Q+] and VB[Q−] can be differential and carry quadrature-phase information. The signals LO[I+] and LO[I−] are differential; the signals LO[Q+] and LO[Q−] are also mutually differential. In addition, the signals LO[I+] and LO[Q+] are out of phase by 90 degrees. With such phase arrangement, the in-phase information and the quadrature-phase information can be up-converted and merged into one signal, e.g., the current Io.

Figure 4:
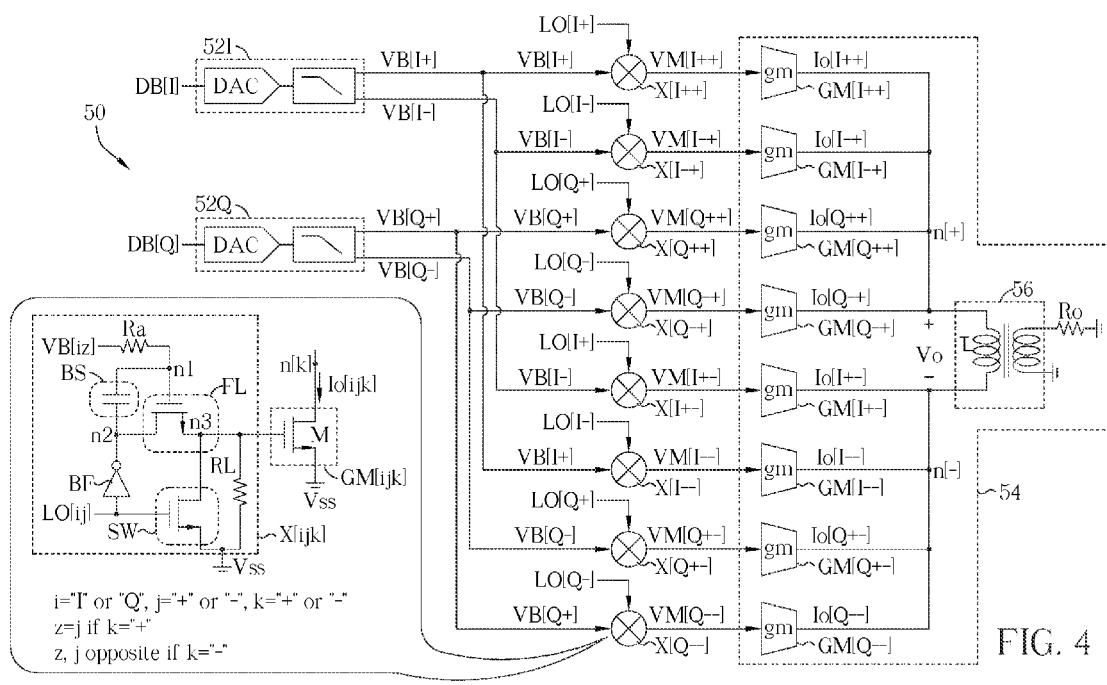

Please refer to FIG. 4 illustrating a signal circuit 50 according to an embodiment of the invention, which includes two converters 52I and 52Q, identical mixers X[I++], X[I−+], X[Q++], X[Q−+], X[I+−], X[I−−], X[Q+−] and X[Q−−], and an amplifier 54. By digital-to-analog conversion, the converter 52I converts a digital input DB[I] to two differential analog signals VB[I+] and VB[I−], and the converter 52Q converts a digital input DB[Q] to two differential analog signals VB[Q+] and VB[Q−]. Each mixer X[ijk] (for i="I" or "Q", j="+" or "−" and k="+" or "−") is arranged to provide a mixed signal VM[ijk] by mixing an oscillation signal LO[ij] and the signal VB[iz] (wherein z=j if k="+", otherwise z and j are opposite, i.e., z="+" if j="−", and z="−" if j="+"). The amplifier 54 includes trans-conductance cells GM[I++], GM[I−+], GM[Q++], GM[Q−+], GM[I+−], GM[−−], GM[Q+−] and GM[Q−−], and a balun 56 as a load. Each trans-conductance cell GM[ijk] (for i="I" or "Q", j="+" or "−", k="+" or "−") is arranged to provide a current Io[ijk] to a node n[k] in response to the signal VM[ijk]. The currents Io[ij+] (for i="I" or "Q", j="+" or "−") are summed at the node n[+], and the currents Io[ij−] are summed at the node n[−]; in response to currents at the nodes n[+] and n[−], an output voltage signal Vo between the nodes n[+] and n[−] can be established across the balun 56 and be transformed to a resistor Ro, e.g., a 50-Ohm antenna for wireless transmission.

Similar to structure and operation of the mixer X[ij] in FIG. 3, the mixer X[ijk] includes resistors Ra and RL, a follower FL, a switch SW, a buffer BF and a bootstrap circuit BS, and cooperates with the trans-conductance cell GM[ijk] implemented by a transistor M.

The signal circuit 50 can be employed to implement double-balanced I-Q signal mixing. The signals VB[I+] and VB[I−] are arrange to carry in-phase information, the signals VB[Q+] and VB[Q−] are arrange to carry quadrature-phase information. The signals LO[I+] and LO[I−] are differential; the signals LO[Q+] and LO[Q−] are also mutually differential. In addition, the signals LO[I+] and LO[Q+] are out of phase by 90 degrees. With such phase arrangement, the in-phase information and the quadrature-phase information can be up-converted and merged. The mixers X[i++] and X[i−+] (for i="I" or "Q") are paired as single-balanced configuration, so are the mixers X[i+−] and X[i−−]. Since the amplifier 54 is a differential amplifier with the nodes n[+] and n[−] as differential input terminals, two differential single-balanced pairs of the mixers (X[i++], X[i−+]) and (X[i+−], X[i−−]) combined as a double-balanced configuration, which mixes information of the digital input DB[i] with the signal LO[ij].

Figure 5:
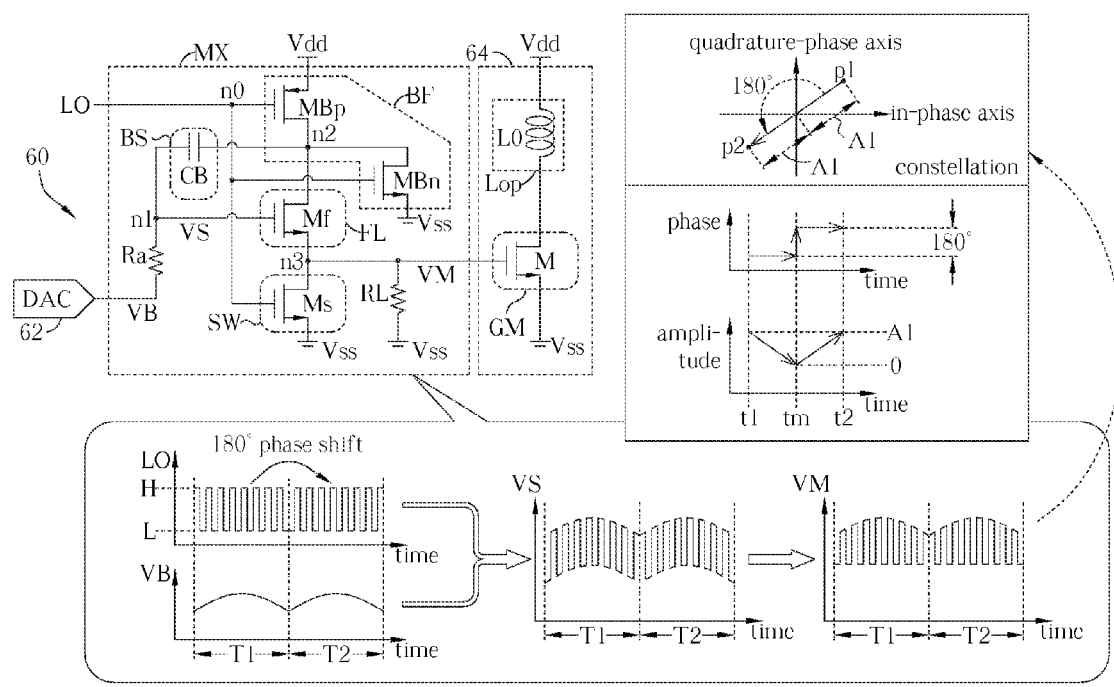

Please refer to FIG. 5 illustrating a signal circuit 60 according to an embodiment of the invention. The signal circuit 60 includes a converter 62, a mixer MX and an amplifier 64. The converter 62, e.g., a DAC, provides a signal VB. Similar to structure and operation of the mixers 20p/20m (FIG. 2), X[ij] (FIG. 3) and X[ijk] (FIG. 4), the mixer MX operates between supply voltages Vdd and Vss, and includes resistors Ra and RL, a buffer BF, a follower FL, a switch SW and a bootstrap circuit BS. The signal VB is coupled to a node n1 via the resistor Ra. The buffer BF can include a pair of complementary transistors MBp (e.g., a p-channel MOS transistor) and MBn (e.g., an n-channel MOS transistor) to form an inverter, which inverts a signal LO received from a node n0 and accordingly provides driving contribution to a node n2. Inversion of the signal LO is also coupled to the node n1 by the bootstrap circuit BS, which can include a capacitor CB, and can thus provide an add-on level between the nodes n1 and n2 in response to a steady-state component of the signal LO. The add-on level, inversion of the signal LO and the signal VB are summed at the node n1 to form a signal VS.

The switch SW, which can include a transistor Ms, is controlled by the signal LO to selectively conduct a node n3 to the supply voltage Vss. When the switch SW conducts, a signal VM at the node n3 is pulled down to level of the supply voltage Vss. The follower FL can include a transistor Mf. When the switch SW stops conduction, if voltage of the signal VM is high enough to keep the transistor Mf turned-on, the follower FL conducts current provide by the buffer BF to the node n3, and thus causes the signal VM to follow the signal VS with an offset level subtracted. The amplifier 64 includes a trans-conductance cell GM (which can include a transistor M) and a load Lop (which can include an inductor L0); as the trans-conductance cell GM conducts a current through the load Lop in response to the signal VM, the signal VM is amplified.

In addition to frequency translation (e.g., up-conversion), the signal circuit of the invention can be utilized to implement an AM-PM combined transmitter. The example shown in FIG. 5 demonstrates such application. The signal LO oscillating at a fixed frequency can be used to carry information by phase. As shown in FIG. 5, during an interval T1, the signal LO embeds a first section of phase information by maintaining a first phase; during a following interval T2, the signal LO transits to a second phase to carry a second section of phase information. For example, the second phase can be 180 degrees different from the first phase to represent that the second section of phase information is different from the first section. On the other hand, the signal VB can be used to carry information by varying amplitude. By mixing the signals VB and LO into the signal VM, the mixer MX respectively impresses information of the signals LO and VB into phase and amplitude of the signal VM. That is, with the signals LO and VB respectively arranged to carry PM information and AM information, the mixed signal VM is an AM-PM-merged signal, and the mixer MX serves as a polar transmitter.

The constellation of the signal VM is also shown in FIG. 5. From time points t1, tm to t2, if phase of the signal LO experiences a 180-degree transition and amplitude of the signal VB gradually varies through a value A1, zero and back to the value A1, the signal VM will leave a trail from a point p1 to a point p2 at the constellation.

Figure 6:
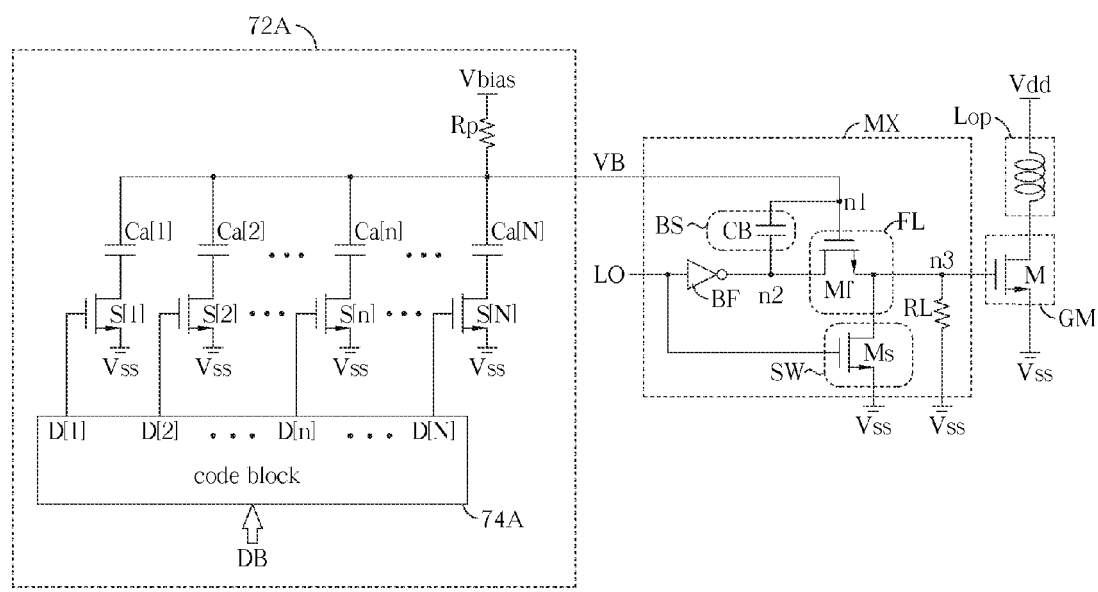
FIG. 6 and FIG. 7 respectively illustrate converters according to embodiments of the invention.

Please refer to FIG. 6 illustrating a converter 72A according to an embodiment of the invention. The converter 72A, e.g., a DAC, can cooperate with a mixer MX of the invention to provide an analog signal VB in response to a digital input DB, so the converted signal VB at a node n1 can be mixed with an oscillation signal LO, amplified by a trans-conductance cell GM and outputted to a load Lop. For example, as respectively shown in FIG. 1, FIG. 2, FIG. 3, FIG. 4 and FIG. 5, the converter 72A can be employed to implement the converters 18, 28p/28m, 42I/42Q, 52I/52Q and 62 in cooperation with the mixers 10, 20p/20m, X[ij], X[ijk] and MX.

Similar to the mixers shown in FIG. 1 to FIG. 5, the mixer MX in FIG. 6 operates with supply voltages Vdd and Vss, and includes a follower FL, a buffer BF, a switch SW and a bootstrap circuit BS. Because the follower FL interfaces the signal VB with high impedance (e.g., equivalent impedance provided by the gate of the transistor Mf), demands for driving strength of the converter 72A are greatly lowered. Accordingly, the converter 72A can employ a design based on voltage dividing of switched-capacitor array for aggressive power reduction, rather than a design employing DC current sources which suffer greater power consumption. As shown in FIG. 6, the converter 72A includes a resistor Rp, a code block 74A, a plurality of switches S[1] to S[N] as converter switches and a plurality of capacitors Ca[1] to Ca[N] as converter capacitors.

The code block 74A receives the digital input DB and provides a plurality control bits D[1] to D[N] in response. For example, the code block 74A is arranged to decode each digitized signal value streamed in the digital input DB to an associated thermometer code, and binary bits of the thermometer code are respectively provided as the bits D[1] to D[N]. The resistor Rp is coupled between a DC bias voltage Vbias and the node n1. Each switch S[n] (for n=1 to N) can be implemented by a transistor (e.g., an n-channel MOS transistor) which has a gate, a source and a drain respectively coupled to the bit D[n], the supply voltage Vss and a terminal of the capacitor Ca[n], with the other terminal of the capacitor Ca[n] coupled to the node n1. The switch S[n] is arranged to selectively conduct the capacitor Ca[n] to the supply voltage Vss in response to the bit D[n]. When the bit D[n] equals a first logic value which turns on the transistor of the switch S[n], the switch S[n] conducts a terminal of the capacitor Ca[n] to the supply voltage Vss, such that the capacitor Ca[n] can share charges of the node n1. If the bit D[n] equals another second logic value which turns off the transistor of the switch S[n], the switch S[n] terminates conduction between the capacitor Ca[n] and the supply voltage Vss, and thus the capacitor Ca[n] does not join to share charges of the node n1. Accordingly, each capacitor Ca[n] can selectively change charges of the node n1 in response to the bit D[n].

Equivalently, the switches S[1] to S[N] and the capacitors Ca[1] to Ca[N] form a switched-capacitor array for voltage dividing. By operations of the switches S[1] to S[N] and the capacitors Ca[1] to Ca[N], the signal VB is established at the node n1 in response to the bits D[1] to D[N], as the bits D[1] to D[N] control how many of the capacitors Ca[1] to Ca[n] are sharing charges of the node n1. For example, to convert a greater digitized signal value streamed in the signal DB, fewer of the bits D[1] to D[N] are decoded to the first logic value by the code block 74A, hence fewer of the capacitors Ca[1] to Ca[N] are arranged to share charges of the node n1, and a higher signal VB is thus maintained and presented at the node n1.

Rather than steadily draining DC current, the converter 72A features a dynamic nature, since the converter 72A only needs minor dynamic (transient) current between different conversions. Hence the converter 72A effectively contributes to power saving.

Figure 7:
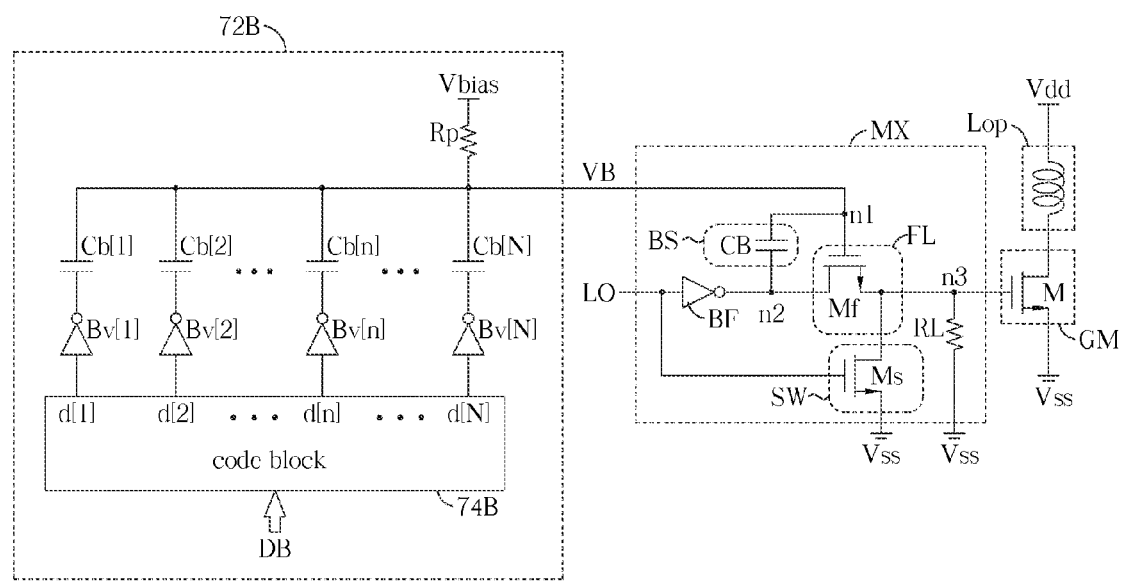

Please refer to FIG. 7 illustrating a converter 72B according to an embodiment of the invention; the converter 72B can replace the converter 72A (FIG. 6) to cooperate with the mixer MX. The converter 72B includes a code block 74B, a plurality of buffers Bv[1] to Bv[N] as converter buffers, and a plurality of capacitors Cb[1] to Cb[N] as converter capacitors. The code block 74B receives the digital input DB and provides a plurality control bits d[1] to d[N] in response. For example, the code block 74B is arranged to decode each digitized signal value streamed in the digital input DB to an associated thermometer code, and binary bits of the thermometer code are provided as the bits d[1] to d[N]. Each buffer Bv[n] (for n=1 to N) is coupled between the bit d[n] and the capacitor Cb[n] for selectively providing charges to the capacitor Cb[n] in response to the bit d[n]. For example, the buffer Bv[n] can be arranged to charge the capacitor Cb[n] with a fixed amount of charges if the bit d[n] equals a first logic value, and to discharge the capacitor Cb[n] if the bit d[n] equals a second logic value other than the first logic value. Each capacitor Cb[n] is coupled between the buffer Bv[n] and the node n1; as the buffer Bv[n] selectively provides charges in response to the bit d[n], the capacitor Cb[n] can therefore selectively change charges of the node n1. With overall charges contributed by the capacitors Cb[1] to Cb[N], the analog voltage signal VB is built and provided at the node n1. For example, to convert a greater digitized signal value streamed in the signal DB, more of the bits d[1] to d[N] are decoded to the first logic value by the code block 74B, hence more of the buffers Bv[1] to Bv[N] are arranged to provide charges to accumulate a higher signal VB.

Each buffer Bv[n] can be implemented by an inverter, thus it does not drain DC current, only needs less dynamic current between conversions. That is, the converter 72B also achieves further power-saving by its dynamic nature.

To sum up, for mixing an input signal (e.g., a low-frequency data signal) with an oscillation signal (e.g., a relative high-frequency LO signal), the invention uses the oscillation signal to bootstrap the input signal, adopts a follower to buffer the bootstrapped input signal, and employs a switch for gating the follower output in synchronization with the oscillation signal. Signal mixing can therefore benefit from simplified structure, less DC current dissipation, reduced power consumption, and compatibility to low-power DAC.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A mixer for providing a mixed signal by mixing an input signal and an oscillation signal, comprising:
   a follower comprising an input terminal, a bias terminal and an output terminal for conducting a driving current from the bias terminal to the output terminal following an internal signal at the input terminal; wherein the input terminal and the bias terminal are respectively coupled to the input signal and the oscillation signal, and the output terminal is arranged to output the mixed signal; and
   a switch coupled to the output terminal for conducting and stopping conducting the output terminal to a reference level respectively when the oscillation signal is at different levels;
   wherein the follower further comprises a transistor which comprises a gate, a drain and a source respectively coupled to the input terminal, the bias terminal and the output terminal.

2. The mixer of claim 1 further comprising:
   a buffer coupled between the oscillation signal and the bias terminal for providing the driving current in response to the oscillation signal.

3. The mixer of claim 2, wherein the buffer is an inverter.

4. The mixer of claim 1 further comprising:
   a bootstrap circuit coupled between the bias terminal and the input terminal for providing an add-on level in response to the oscillation signal.

5. The mixer of claim 4, wherein the bootstrap circuit comprises a capacitor coupled between the bias terminal and the input terminal.

6. The mixer of claim 1, wherein a frequency band of the oscillation signal is higher than a frequency band of the input signal.

7. The mixer of claim 1, wherein the oscillation signal is arranged to carry a PM (phase-modulation) information, the input signal is arranged to carry an AM (amplitude-modulation) information, and the mixed signal is an AM-PM-merged signal.

8. A signal circuit comprising:
   a first number of converters, each said converter arranged to provide a converted signal in response to an associated digital input; and
   a second number of mixers, each said mixer arranged to provide an associated mixed signal by mixing an associated one of the first number of converted signals and an oscillation signal, and comprising:
a follower comprising an input terminal, a bias terminal and an output terminal for conducting a driving current from the bias terminal to the output terminal following an internal signal at the input terminal; wherein the input terminal and the bias terminal are respectively coupled to the associated converted signal and the oscillation signal, and the output terminal is arranged to output the associated mixed signal; and
a switch coupled to the output terminal for conducting and stopping conducting the output terminal to a reference level respectively when the oscillation signal is at different levels.

9. The signal circuit of claim 8, wherein each said mixer further comprises:
a buffer coupled between the oscillation signal and the bias terminal for providing the driving current in response to the oscillation signal.

10. The signal circuit of claim 8, wherein each said mixer further comprises:
a bootstrap circuit coupled between the bias terminal and the input terminal for providing an add-on level in response to the oscillation signal.

11. The signal circuit of claim 8, wherein each said converter comprises:
a converter terminal for outputting the converted signal; and
a plurality of converter capacitors commonly coupled to the converter terminal for selectively changing charges of the converter terminal in response to the associated digital input.

12. The signal circuit of claim 11, wherein each said converter further comprises:
a plurality of converter switches, each of the converter switches selectively conducting one of the converter capacitors to a second reference level for sharing charges of the converter terminal in response to the associated digital input.

13. The signal circuit of claim 11, wherein each said converter further comprises:
a plurality of converter buffers, each of the converter buffers arranged to selectively provide charges to one of the converter capacitors in response to the associated digital input.

14. The signal circuit of claim 8 further comprising:
an amplifier coupled to the second number of mixers for amplifying the mixed signal of each said mixer and providing an amplified signal in response.

\* \* \* \* \*